United States Patent
Lee

(10) Patent No.: US 7,777,573 B2
(45) Date of Patent: Aug. 17, 2010

(54) OPERATIONAL AMPLIFIER HAVING ADJUSTABLE BIAS CURRENT AND RELATED SOURCE DRIVER OF DISPLAY THEREOF

(75) Inventor: Ching-Chung Lee, Tainan County (TW)

(73) Assignee: Himax Technologies Limited, Fonghua Village, Sinshih Township, Tainan County (TW)

( * ) Notice: Subject to any disclaimer, the term of this patent is extended or adjusted under 35 U.S.C. 154(b) by 177 days.

(21) Appl. No.: 12/129,636

(22) Filed: May 29, 2008

(65) Prior Publication Data

US 2009/0295486 A1 Dec. 3, 2009

(51) Int. Cl.
*H03F 3/04* (2006.01)
(52) U.S. Cl. .................................. 330/296; 330/288
(58) Field of Classification Search .................. 330/285, 330/288, 296
See application file for complete search history.

(56) References Cited

U.S. PATENT DOCUMENTS

| 6,417,735 | B1 * | 7/2002 | Luo | 330/296 |
| 7,365,604 | B2 * | 4/2008 | Luo et al. | 330/296 |
| 2009/0160558 | A1 * | 6/2009 | Choi et al. | 330/296 |

* cited by examiner

*Primary Examiner*—Khanh V Nguyen
(74) *Attorney, Agent, or Firm*—Winston Hsu

(57) ABSTRACT

An operational amplifier includes an amplifying circuit and a bais current generating circuit. The bias current generating circuit generates a bias current to the amplifying circuit. The amplifying circuit comprises a current adjusting unit and a current mirror. The current adjusting circuit has a storage element, receives a reference current and generating a passing current. The passing current is gradually adjusted utilizing the storage element according to a control signal. The current mirror receives the passing current to generate the bias current.

20 Claims, 6 Drawing Sheets

OPERATIONAL AMPLIFIER HAVING ADJUSTABLE BIAS CURRENT AND RELATED SOURCE DRIVER OF DISPLAY THEREOF

BACKGROUND OF THE INVENTION

1. Field of the Invention

The invention relates to an operational amplifier, and more particularly, to a source driver of display that includes an operational amplifier having an adjustable bias current.

2. Description of the Prior Art

Liquid crystal displays (LCDs) have led us to a brave new visual world for their small size, light weight, and extensive display capabilities. One important subject in evaluating the display capability of an LCD is its response time. An LCD having a shorter response time can clearly display fast-moving objects, whereas an LCD having a longer response time would create a smear or blur pattern around moving objects, making them unacceptable for viewing moving video. To improve the response time of the LCD, an important issue is to improve the driving capability of the LCD's source driver. As known by people skilled in the art, the LCD's source driver drives the LCD by charging each pixel of the LCD to a corresponding voltage level. A bottleneck in improving the driving capability is the charging time of each pixel being dominated by the pixels' capacitive nature.

Certain conventional techniques have been developed to improve LCD response times. With regards to the driving current, FIG. 1 shows an operational amplifier (OP-AMP) at the source driver's output stage, which has an adjustable bias current. The OP-AMP 100 generates an output $V_{out}$ according to an input $V_{in}$, and is implemented using transistors M1-M5, capacitor C, and current sources $I_0$, $I_1$, and $I_2$. While the OP-AMP 100 is in a steady mode, it is normally biased by a first current source $I_1$. When the OP-AMP 100 is in a driving mode, the switch SW is turned on to boost the bias current of OP-AMP 100 by adding a second current source $I_2$. The driving capability and slew rate of the OP-AMP 100 will hence be improved a great deal at the driving mode. The steady mode can be defined as a period that the voltage of input $V_{in}$ of the OP-AMP 100 is not changing (steady). The driving mode can be defined as a period that the voltage of the input $V_{in}$ of the OP-AMP 100 is changing (transition). This technique, however, has a drawback of causing a sudden bias current change, resulting in output waveform glitches. The glitches in the output waveform will trigger bouncing and cause mura on the LCD, significantly degrading the display quality.

SUMMARY OF THE INVENTION

To improve the driving capability of operational amplifiers and to solve the glitches problems mentioned above, one objective of the invention is to provide an operational amplifier that can gradually adjust its bias current and a source driver of a display having the operational amplifier.

According to one exemplary embodiment of the present invention, an operational amplifier is provided. An operational amplifier includes an amplifying circuit and a bais current generating circuit. The bias current generating circuit generates a bias current to the amplifying circuit. The amplifying circuit comprises a current adjusting unit and a current mirror. The current adjusting circuit has a storage element, receives a reference current and generating a passing current. The passing current is gradually adjusted utilizing the storage element according to a control signal. The current mirror receives the passing current to generate the bias current.

According to one exemplary embodiment of the present invention, a source driver of a display is provided. The source driver includes a digital-to-analog converter and an operational amplifier. The digital-to-analog converter converts a digital pixel signal into an analog pixel signal. The operational amplifier drives at least a pixel of the display according to the analog pixel signal, and includes an amplifying circuit and a bais current generating circuit. The bias current generating circuit generates a bias current to the amplifying circuit. The amplifying circuit comprises a current adjusting unit and a current mirror. The current adjusting circuit has a storage element, receives a reference current and generating a passing current. The passing current is gradually adjusted utilizing the storage element according to a control signal. The current mirror receives the passing current to generate the bias current.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
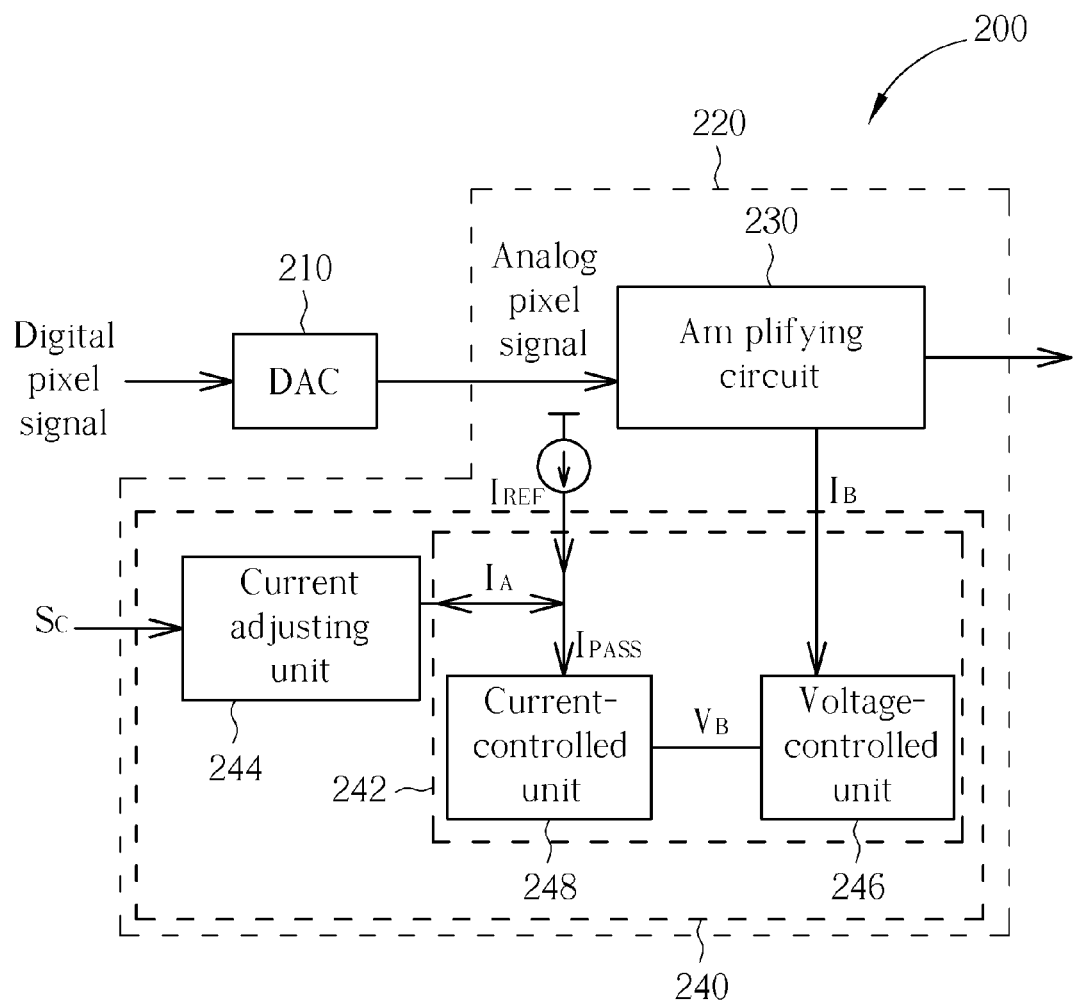
FIG. 2 is an exemplary diagram of a source driver of display according to an embodiment of the present invention.

FIG. 2 is an exemplary diagram of a source driver of a display (e.g., an LCD panel) according to an embodiment of the present invention. The source driver 200 comprises, but is not limited to, a digital-to-analog converter (DAC) 210 and an operational amplifier 220. Please note that for simplicity, only the components related to the invention are shown in FIG. 2. The digital-to-analog converter 210 converts a digital pixel signal into an analog pixel signal. The operational amplifier 220, serving as an output stage of the source driver 200, is coupled to the digital-to-analog converter 210 and drives at least a data line of the display (not shown in FIG. 2) according to the analog pixel signal. In other words, the operational amplifier 220 drives the corresponding data line to a certain voltage level according to the analog pixel signal.

Figure 1:
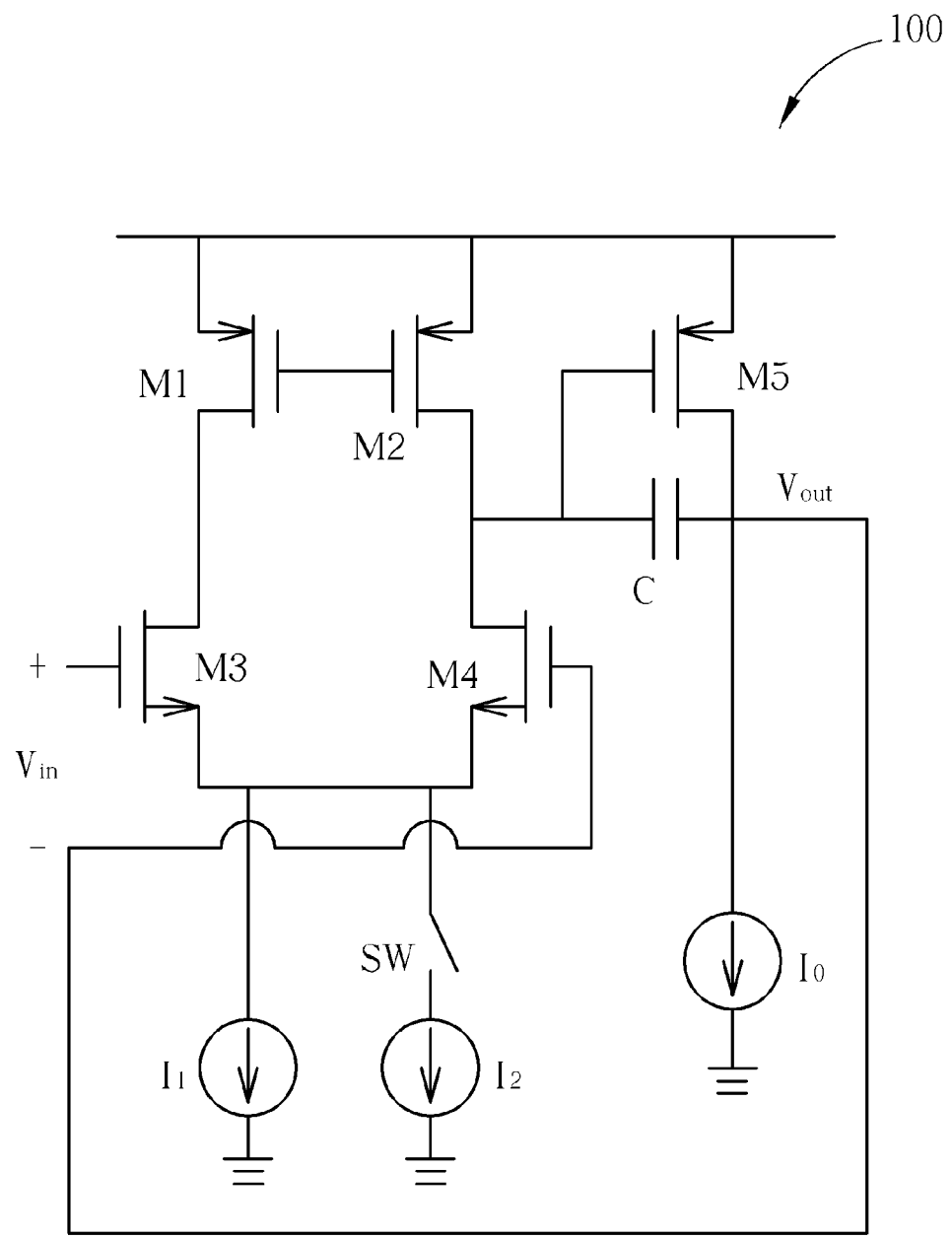
FIG. 1 is an exemplary diagram of a prior art operational amplifier at a source driver's output stage.

The operational amplifier 220 comprises an amplifying circuit 230 and a bias current generating circuit 240. In FIG. 2, the amplifying circuit 230 is shown in the form of a functional block because there are numerous ways to implement this block. Taking the circuit architecture shown in FIG. 1 as an example (but not limiting the invention to it), the amplifying circuit 230 can be implemented using transistors M1-M5, capacitor C, and current source $I_0$. People skilled in the art will readily appreciate that other designs of implementing the amplifying circuit 230 are feasible. Further description is omitted here for brevity.

The bias current generating circuit 240 is coupled to the amplifying circuit 230 and generates a bias current $I_B$ for the amplifying circuit 230. The bias current generating circuit 240 provides the bias current $I_B$ that can be changed gradually for the amplifying circuit 230 to prevent output waveforms of the operational amplifier 220 from having glitches. The bias current generating circuit 240 can be regarded as analogous to the current sources $I_1$ and $I_2$ in FIG. 1, but it should be noted that they are not the same, since the current sources $I_1$ and $I_2$ in FIG. 1 will cause a sudden bias current change. As the bias current $I_B$ is gradually changed, bias voltages of amplifying circuit 230 determined according to the bias current $I_B$ are also changed gradually, thereby reducing or eliminating the undesired glitch phenomenon can be. The detailed implementation of the bias current generating circuit 240 is described below.

The bias current generating circuit 240 comprises a current mirror 242 and a current adjusting unit 244. The current mirror 242 receives a passing current $I_{PASS}$ to generate the bias current. The current mirror 242 includes a voltage-controlled unit 246 and a current-controlled unit 248. The current-controlled unit 242 generates a bias voltage $V_B$ according to the passing current $I_{PASS}$ flowing through the current-controlled unit 242, wherein the passing current $I_{PASS}$ is at least a portion of a reference current $I_{REF}$. The reference current $I_{REF}$ can be generated by a current source or any other circuits comprised in or external to the source driver 200. The voltage-controlled unit 246 is coupled to the current-controlled unit 248 and generates the bias current $I_B$ according to the bias voltage $V_B$. The current adjusting unit 244, having a storage element (not shown in FIG. 2), is coupled to the current-controlled unit 248 and gradually adjusts the passing current $I_{PASS}$ utilizing the storage element according to a control signal $S_C$. The control signal $S_C$ that can be generated according to a TP1 signal generated by a timing controller of the display (not shown in FIG. 2) controls the current adjusting unit 244. For example, when the TP1 signal indicates that the pixel signal outputted by the operational amplifier 220 is about to have a level transition, the control signal $S_C$ controls the current adjusting unit 244 such that the operational amplifier 220 has a higher driving capability, or a higher maximum output current. In other words, in a driving mode, the current adjusting unit 244 makes the passing current substantially equal to the reference current $I_{REF}$ according to the control signal $S_C$, which in turn maintains the bias current $I_B$ and the driving ability of the operational amplifier 220. The relation between the control signal $S_C$ and the current adjusting unit 244 can be designed according to requirements.

When the passing current $I_{PASS}$ flowing through the current-controlled unit 248 is substantially equal to the reference current $I_{REF}$, the bias voltage $V_B$ and the bias current $I_B$ are fixed if the reference current $I_{REF}$ is fixed. In order to change the bias current $I_B$, the current adjusting unit 244 is controlled by the control signal $S_C$, thereby sinking a part of the reference current $I_{REF}$ or adding an adjusting current $I_A$ to change the passing current $I_{PASS}$. In other words, in a steady mode, the current adjusting unit 244 gradually sinks a part of the reference current $I_{REF}$, so as to make the passing current $I_{PASS}$ be smaller than the reference current $I_{REF}$, which in turn reduces the bias current $I_B$ and the driving capability of the operational amplifier 220. To avoid or alleviate a sudden change in the current or voltage, the storage element is required to smoothen the change.

Figure 3:
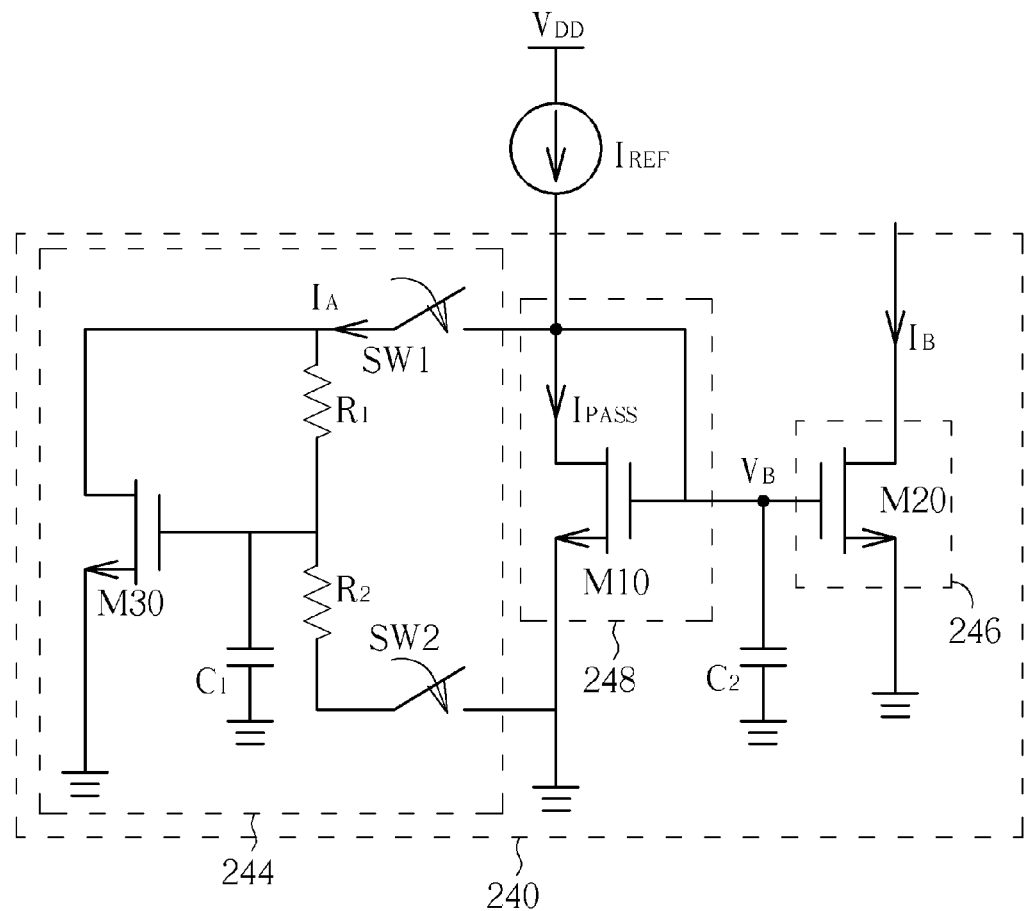
FIG. 3 is an exemplary circuit diagram of a bias current generating circuit shown in FIG. 2.

FIG. 3 is an exemplary circuit diagram of the bias current generating circuit 240 shown in FIG. 2. In the exemplary bias current generating circuit 240, the current-controlled unit 248 comprises a first transistor M10 having a gate node coupled to a drain node of the first transistor M10. The drain node of the first transistor M10 receives the passing current $I_{PASS}$. A source node of the first transistor M10 is coupled to ground. The voltage-controlled unit 246 comprises a second transistor M20 having a gate node coupled to the gate node of the first transistor M10. The drain node of the second transistor M20 drains the bias current $I_B$. A source node of the second transistor M20 is coupled to the ground. The current adjusting unit 244 comprises a first switch SW1, a second switch SW2, a adjusting transistor M30, a predetermined capacitor $C_1$, a first resistor $R_1$, and a second resistor $R_2$. The adjusting transistor M30 has a drain node coupled to the first switch SW1, a gate node coupled between resistors $R_1$ and $R_2$, and a source node coupled to the ground. The switches SW1 and SW2 are controlled by the control signal $S_C$.

Figure 4:
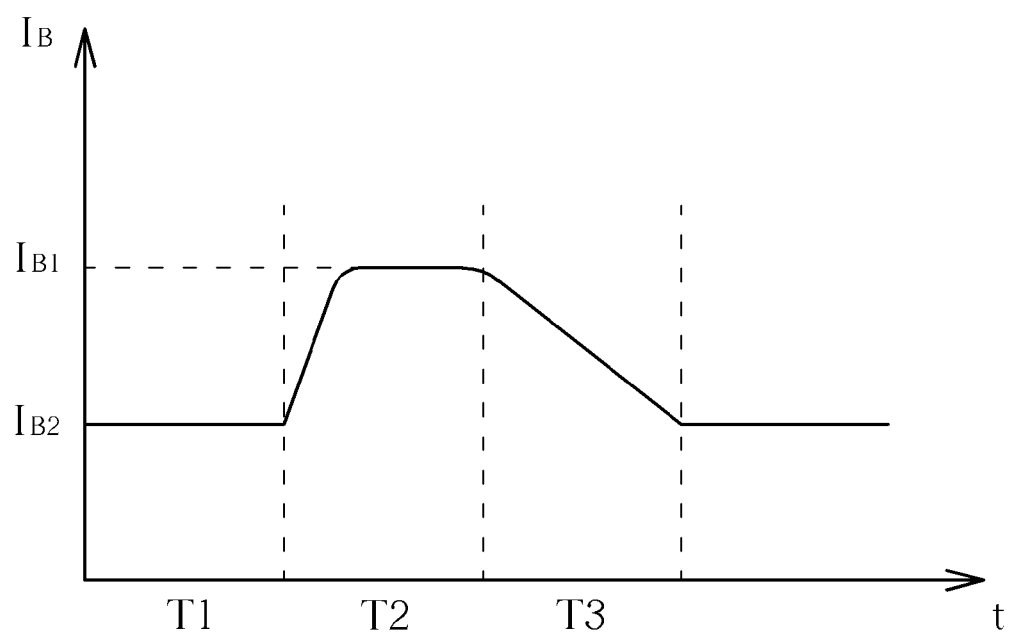
FIG. 4 shows the waveform of the bias current.

FIG. 4 is diagram of bias current for operational amplifier versus time. When the operational amplifier 220 is in a driving mode at the period T2, the current adjusting unit 244 is controlled by the control signal SC to turn off the first switch SW1, and thus the passing current $I_{PASS}$ is substantially equal to the reference current $I_{REF}$. When the first transistor M1 and the second transistor M2 are substantially identical (it should be noticed that they can be alternatively designed with different aspect ratios), the bias current $I_B$ generated by the second transistor M2 will be substantially equal to the passing current $I_{PASS}$ and the reference current $I_{REF}$, as indicated by $I_{B1}$.

When the operational amplifier 220 is in a steady mode at the period T3, the current adjusting unit 244 is controlled by the control signal $S_C$ to turn on the first switch SW1, and thus the passing current $I_{PASS}$ will be smaller than the reference current $I_{REF}$, since the current adjusting unit 244 sinks a part of the reference current $I_{REF}$ gradually and stores the sinked charge in the first capacitor $C_1$. The bias voltage $V_B$ generated by the first transistor M1 also gradually drops off due to the gradually reducing passing current $I_{PASS}$. Hence, the bias current $I_B$ also gradually reduces during the period T3 in FIG. 4.

The adjusting transistor M3 is turned on by the voltage across the first capacitor $C_1$ until the first capacitor $C_1$ stores sufficient charge. The transistors M1 and M3 share the reference current $I_{REF}$ according to their relative sizes (i.e., aspect ratios). Assuming that the transistors M1 and M3 are substantially identical (but it should be noted that they can be designed with other aspect ratios), the adjusting current $I_A$ and the passing current $I_{PASS}$ are each substantially equal to half of the reference current $I_{REF}$, as is the bias current $I_B$. The bias current $I_B$ is gradually reduced, successfully, and the decreasing speed of the bias current $I_B$ can be determined by characteristics of the first capacitor $C_1$ and first resistor $R_1$.

When the bias current $I_B$ has to be increased in the driving mode the first switch SW1 is turned off by control signal $S_C$. Referring to the period T2 in FIG. 4, the bias current $I_B$, however, will not suddenly boost due to the second capacitor $C_2$. The speed of increase of the bias current $I_B$ can be determined by a characteristic of the second capacitor $C_2$. In the driving mode, the second switch SW2 can be turned on by the control signal $S_C$ to discharge the first capacitor $C_1$ for the next charge sinking operation. In the steady mode, the second switch SW2 cam be turned off by the control signal $S_C$. The turning on/off operation of the first and second switches can be reversed, or the second switch SW2 can be turned off when the first switch is turned off, when the first capacitor $C_1$ is sufficiently discharged.

Regarding the current adjusting unit 244 illustrated above, the bias current $I_B$ is higher when the operational amplifier 220 is in a driving mode, and the bias current $I_B$ is lower when the operational amplifier 220 is in a steady mode, so as to enhance the driving capability of the operational amplifier 220. The relation between the control signal $S_C$ and the current adjusting unit 244 can be designed as follows: for the steady mode, the control signal $S_C$ controls the current adjusting unit to sink a part of current from the reference current $I_{REF}$ 244 when the operational amplifier 220 has driven the corresponding data line to a target; for the driving mode for higher driving capability, the control signal $S_C$ controls the current adjusting unit 244 to make the passing current $I_{PASS}$ substantially equal to the reference current $I_{REF}$ when the operational amplifier 220 is about to drive the data line with another voltage.

Figure 5:
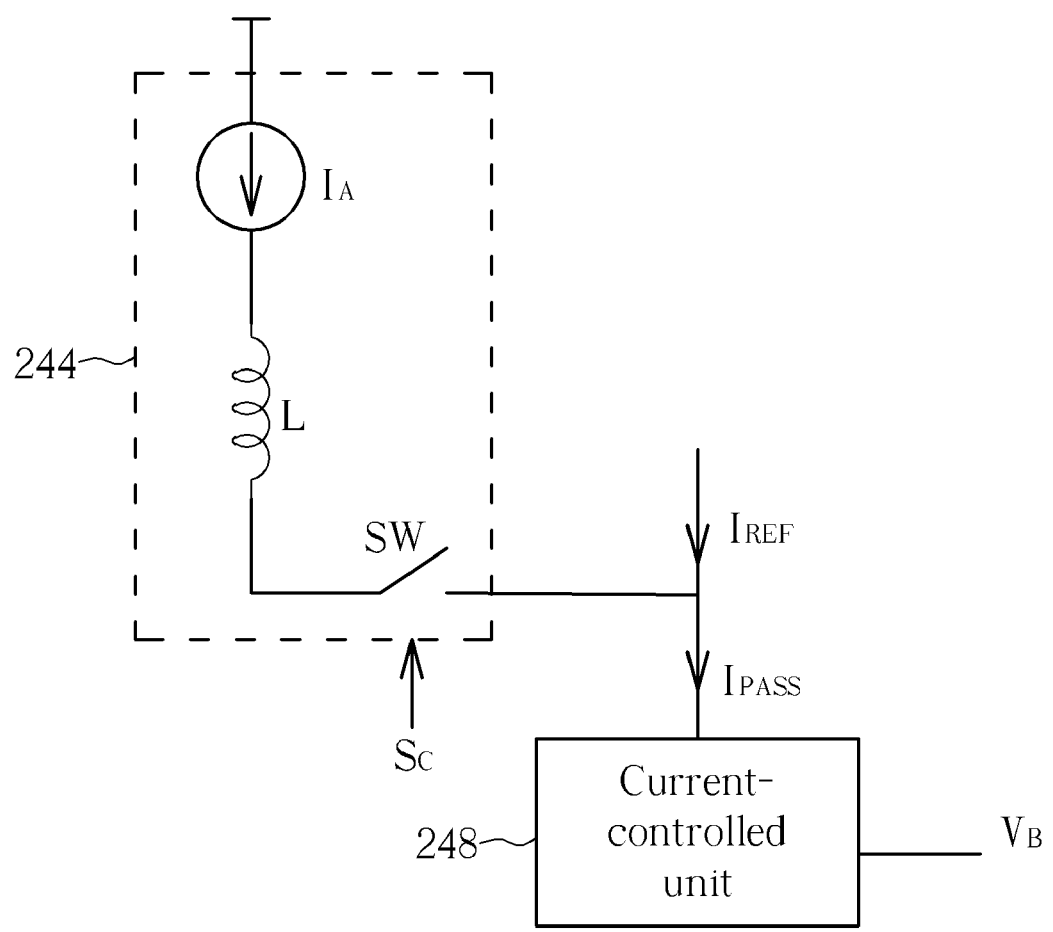
FIG. 5 shows another exemplary circuit diagram of the current adjusting unit and the current-controlled unit shown in FIG. 2.

FIG. 5 shows another exemplary circuit diagram of the current adjusting unit and the current-controlled unit shown in FIG. 2. In FIG. 5, the current adjusting unit 244 comprises a switch SW, an inductor L, and a current source $I_A$. When the switch SW is turned off by the control signal $S_C$ in the steady mode, the passing current $I_{PASS}$ is substantially equal to the reference current $I_{REF}$. When the switch SW is turned on by the control signal $S_C$ in the driving mode, the passing current $I_{PASS}$ is gradually increased due to a part of the adjusting current $I_A$ being gradually added to it. The adjusting current $I_A$ is gradually added into the current-controlled unit 248 because the current flowing through the inductor L will not suddenly change. As illustrated above, the bias voltage $V_B$ and corresponding bias current $I_B$ are also gradually increased.

Figure 6:
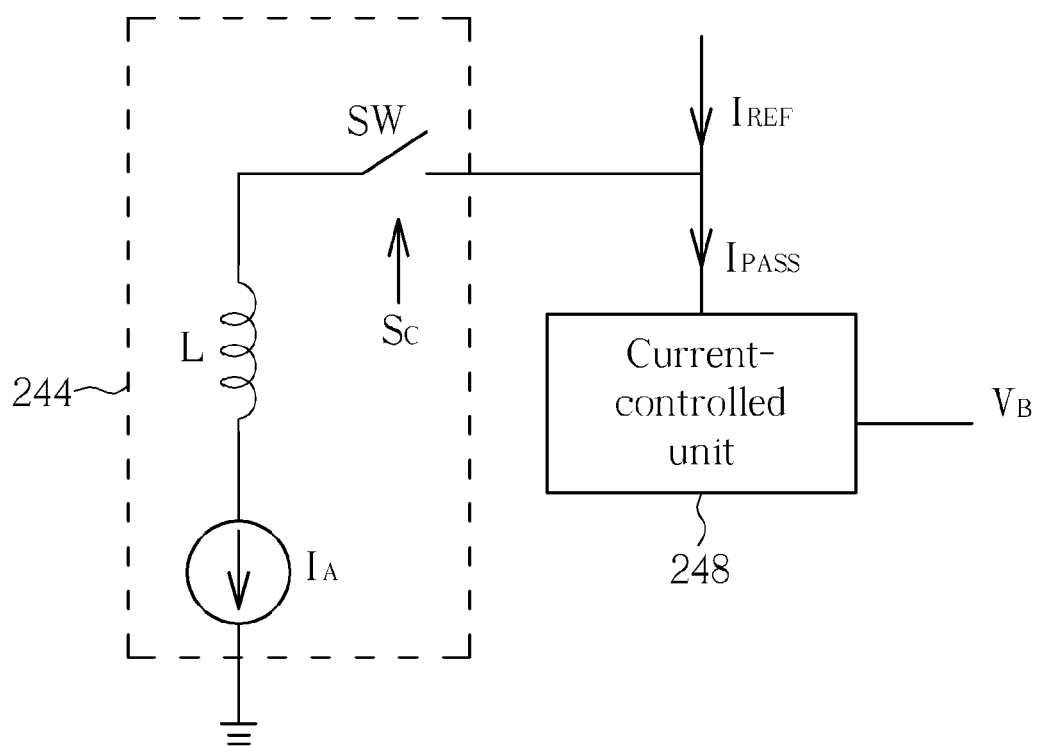
FIG. 6 shows yet another exemplary circuit diagram of the current adjusting unit and the current-controlled unit shown in FIG. 2.

FIG. 6 shows yet another exemplary circuit diagram of the current adjusting unit and the current-controlled unit shown in FIG. 2. The operation of current adjusting unit 244 in FIG. 6 is similar to the operation of current adjusting unit 244 in FIG. 5 except that the current adjusting unit 244 in FIG. 6 gradually sinks part of the reference current $I_{REF}$ to change the current flowing through the current-controlled unit 248. Therefore, related descriptions are omitted here for brevity. Please note that the function of adding current (FIG. 5) and sinking current (FIGS. 3 and 6) can be combined in one current adjusting unit 244: people skilled in the art can readily implement the current adjusting unit 244 having combined functions under the teaching of the above-mentioned embodiments of the invention.

To conclude, the embodiments of the invention provide an operational amplifier that gradually adjusts its bias current and a source driver of a display (e.g., an LCD panel) having the disclosed operational amplifier. Hence, the driving capability of the source driver is improved and the glitch phenomenon at the output waveform of the source driver can be reduced or eliminated, therefore allowing the display to provide images having higher video quality.

Those skilled in the art will readily observe that numerous modifications and alterations of the device and method may be made while retaining the teachings of the invention.

What is claimed is:

1. An operational amplifier, comprising:
   an amplifying circuit; and
   a bias current generating circuit, for generating a bias current to the amplifying circuit, comprising:
      a current adjusting unit, having a storage element, for receiving a reference current and generating a passing current, wherein the passing current is gradually adjusted utilizing the storage element according to a control signal; and
      a current mirror for receiving the passing current to generate the bias current.

2. The operational amplifier of claim 1, wherein, in a driving mode, the current adjusting unit makes the passing current substantially equal to the reference current according to the control signal.

3. The operational amplifier of claim 2, wherein, in a steady mode, the current adjusting unit gradually sinks a part of the reference current, so as to make the passing current be smaller than the reference current, which in turn reduces the bias current.

4. The operational amplifier of claim 3, wherein the storage element of the current adjusting unit is a capacitive element, and the current adjusting unit further comprises:
   a first switch controlled according to the control signal;
   an adjusting transistor, having a first source/drain coupled to the reference current via the first switch, a gate connected to the capacitive element; and
   a first resistive element, coupled between the gate and the first source/drain of the adjusting transistor;
   wherein, in the steady mode, the first switch is turned on, and in the driving mode, the first switch is turned off.

5. The operational amplifier of claim 4, wherein the current adjusting unit further comprises a second switch for selectively drains charges of the capacitive element according to the control signal;
   wherein, in the steady mode, the second switch is turned off, and in the driving mode, the second switch is turned on.

6. The operational amplifier of claim 5, wherein the current adjusting unit further comprises a second resistive element coupled between the capacitor and the second switch.

7. The operational amplifier of claim 1, wherein the storage element is an inductor.

8. The operational amplifier of claim 1, wherein the current mirror comprises:
   a current-controlled unit, for generating a bias voltage according to the passing current, wherein the passing current is at least a portion of the reference current; and
   a voltage-controlled unit, for generating the bias current according to the bias voltage.

9. The operational amplifier of claim 8, wherein:
   the current-controlled unit comprises a first transistor having a first source/drain, a second source/drain and a gate coupled to the first source/drain of the first transistor, the first source/drain of the first transistor being for receiving the passing current, and the second source/drain of the first transistor being coupled to a reference voltage level; and
   the voltage-controlled unit comprises a second transistor having a first source drain, a second source/drain and a gate coupled to the gate of the first transistor, the first source/drain of the second transistor being for outputting the bias current, and a second source/drain of the second transistor being coupled to the reference voltage level.

10. The operational amplifier of claim 9, further comprising a capacitive element coupled between the gate of the first transistor and the reference voltage level.

11. A source driver of a display, comprising:
- a digital-to-analog converter, converting a digital pixel signal to an analog pixel signal; and
- an operational amplifier, coupled to the digital-to-analog converter, driving at least a data line of the display according to the analog pixel signal, the operational amplifier comprising:
    - an amplifying circuit; and
    - a bias current generating circuit, for generating a bias current to the amplifying circuit, comprising:
        - a current adjusting unit, having a storage element, for receiving a reference current and generating a passing current, wherein the passing current is gradually adjusted utilizing the storage element according to a control signal; and
        - a current mirror for receiving the passing current to generate the bias current.

12. The source driver of claim 11, wherein, in a driving mode, the current adjusting unit makes the passing current substantially equal to the reference current according to the control signal.

13. The source driver of claim 12, wherein, in a steady mode, the current adjusting unit gradually sinks a part of the reference current, so as to make the passing current be smaller than the reference current, which in turn reduces the bias current.

14. The source driver of claim 13, wherein the storage element of the current adjusting unit is a capacitive element, and the current adjusting unit further comprises:
- a first switch controlled according to the control signal;
- an adjusting transistor, having a first source/drain coupled to the reference current via the first switch, a gate connected to the capacitive element; and
- a first resistive element, coupled between the gate and the first source/drain of the adjusting transistor;
- wherein, in the steady mode, the first switch is turned on, and in the driving mode, the first switch is turned off.

15. The source driver of claim 14, wherein the current adjusting unit further comprises a second switch for selectively drains charges of the capacitive element according to the control signal;
- wherein, in the steady mode, the second switch is turned off, and in the driving mode, the second switch is turned on.

16. The source driver of claim 15, wherein the current adjusting unit further comprises a second resistive element coupled between the capacitive element and the second switch.

17. The source driver of claim 11, wherein the current mirror comprises:
- a current-controlled unit, for generating a bias voltage according to the passing current, wherein the passing current is at least a portion of the reference current; and
- a voltage-controlled unit, for generating the bias current according to the bias voltage.

18. The source driver of claim 17, wherein:
- the current-controlled unit comprises a first transistor having a first source/drain, a second source/drain and a gate coupled to the first source/drain of the first transistor, the first source/drain of the first transistor being for receiving the passing current, and the second source/drain of the first transistor being coupled to a reference voltage level; and
- the voltage-controlled unit comprises a second transistor having a first source drain, a second source/drain and a gate coupled to the gate of the first transistor, the first source/drain of the second transistor being for outputting the bias current, and a second source/drain of the second transistor being coupled to the reference voltage level.

19. The source driver of claim 18, further comprising a capacitive element coupled between the gate of the first transistor and the reference voltage level.

20. The source driver of claim 11, wherein the control signal is generated according to a TP1 signal generated by a timing controller of the display, where the TP1 signal indicates a level transition of an output of the operational amplifier.

* * * * *